United States Patent [19]

Sterzer

[11] 3,848,141

[45] Nov. 12, 1974

[54] SEMICONDUCTOR DELAY LINES USING THREE TERMINAL TRANSFERRED ELECTRON DEVICES

[75] Inventor: Fred Sterzer, Princeton, N.J.

[73] Assignee: RCA Corporation, New York, N.Y.

[22] Filed: Mar. 26, 1973

[21] Appl. No.: 344,862

[52] U.S. Cl. .......... 307/293, 307/299 R, 317/234 V, 331/107 G

[51] Int. Cl. .......... H03k 17/26

[58] Field of Search .......... 307/293, 299; 317/234; 331/107 G

[56] References Cited

UNITED STATES PATENTS

| | | | |
|---|---|---|---|
| 3,452,221 | 6/1969 | Gunn | 317/234 V |
| 3,493,842 | 2/1970 | Robrock | 307/299 |
| 3,535,601 | 10/1970 | Matsukura et al. | 317/234 V |
| 3,538,400 | 11/1970 | Yanai et al. | 317/234 V |
| 3,566,306 | 2/1971 | Esposito et al. | 317/234 V |
| 3,577,018 | 5/1971 | Wada et al. | 307/299 R |
| 3,588,736 | 6/1971 | McGroddy | 307/299 |
| 3,601,713 | 8/1971 | Solomon et al. | 331/107 G |

*Primary Examiner*—Stanley D. Miller, Jr.
*Attorney, Agent, or Firm*—Edward J. Norton; Joseph D. Lazar; Donald E. Mahoney

[57] ABSTRACT

Presented is a semiconductor delay line which makes use of the transferred electron effect in order to provide useful delays in information processing applications at multigigabit rates.

15 Claims, 11 Drawing Figures

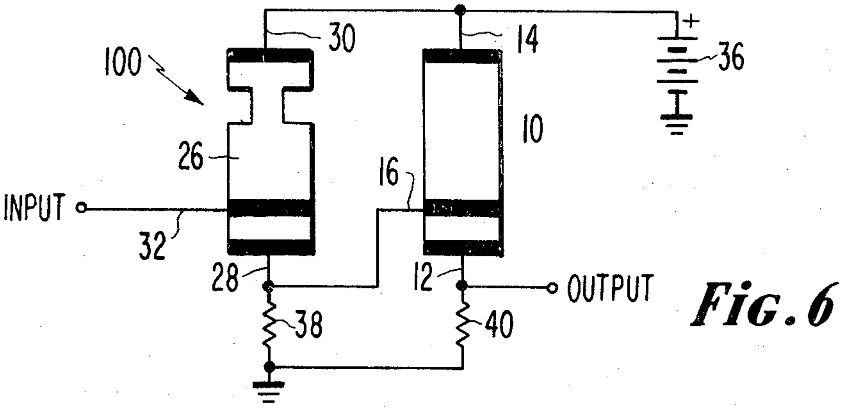
FIG. 6
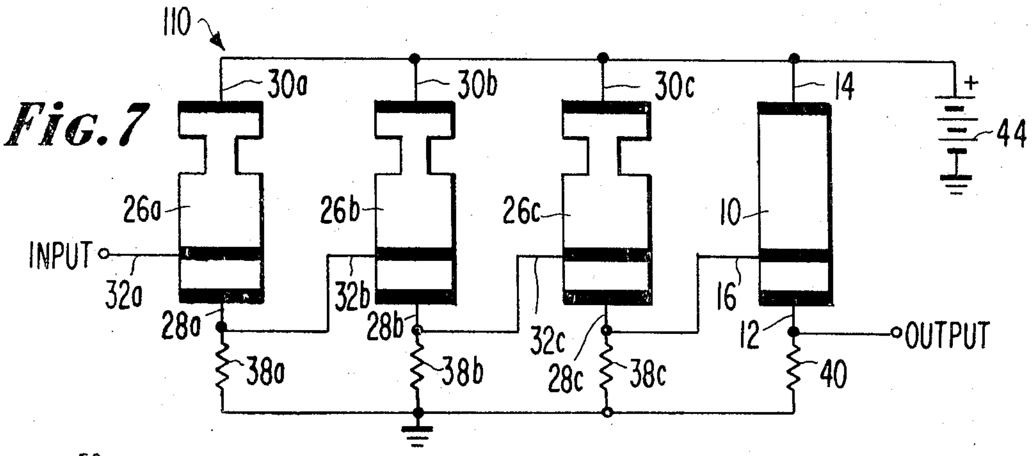
FIG. 7
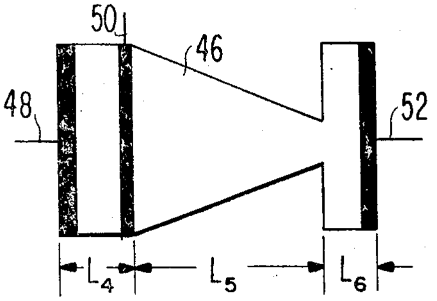
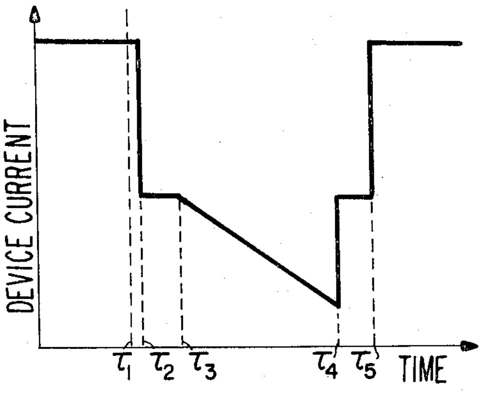
FIG. 8 FIG. 9
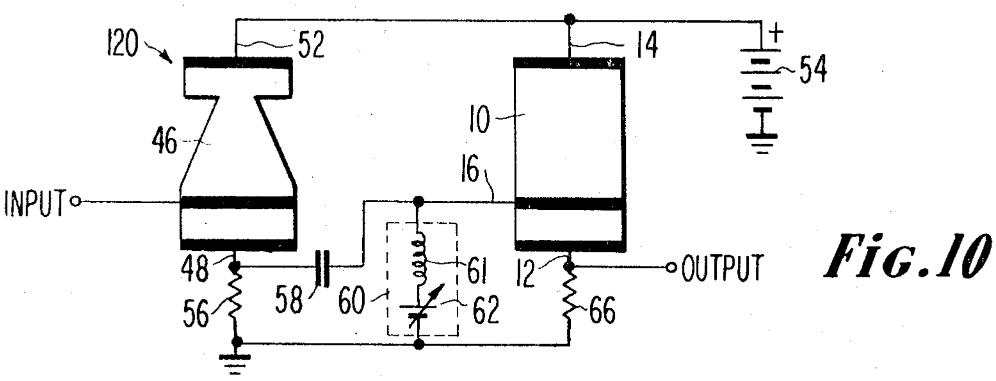
FIG. 10

SEMICONDUCTOR DELAY LINES USING THREE TERMINAL TRANSFERRED ELECTRON DEVICES

BACKGROUND OF THE INVENTION

The present invention relates to delay lines and in particular relates to semiconductor delay lines.

There are many signal processing applications in communications, ECM, and radar which require that high frequency signals be delayed for times ranging upward from a nanosecond. In order to achieve such delays, it has been necessary to use passive delay lines which are lossy and often bulky.

While it would be desirable to use an active delay line in order to achieve reductions in both size and loss, in the past, such active delay lines have not been available due to the inherent limitations of silicon semiconductor devices. It has been shown that by taking advantage of two-valley bulk semiconductor devices which exhibit the transferred electron effect it is possible to design a class of circuits which can operate at extremely high speeds compared to silicon circuits.

By a device capable of exhibiting the transferred electron effect, is meant a device of characteristics such that when there is applied to the device an electric field higher than a threshold value determined by the material comprising the device, a high field domain is formed within the device which travels through the device under the influence of the applied voltage to result in a temporary decrease in current through the device.

SUMMARY OF THE INVENTION

A semiconductor delay line is presented which comprises a first three-terminal transferred electron device having input, output and third terminals, the device generating an output signal in response to a predetermined DC bias voltage coupled to the third terminal and an input signal having a predetermined waveform coupled to the device input terminal, the device output signal having a nonuniform current characteristic; an active element having input and output terminals; means for biasing the transferred electron device at a voltage above its domain sustaining voltage and below its threshold voltage; means for biasing the active element below its triggering threshold; means for coupling the first device output signal from the first device output terminal to the input terminal of the active element whereby the active element will be triggered by the transferred electron device into generating an active element output electrical signal having the input signal waveform following a delay determined by the nonuniform current characteristic of the transferred electron device output signal, the biasing means for the transferred electron device, and the threshold level of the active element.

BRIEF DESCRIPTION OF THE DRAWINGS

FIG. 6 is a schematic illustration of one embodiment of the present invention;

FIG. 7 is a schematic illustration of another embodiment of the present invention;

FIG. 8 is a schematic illustration of another type of shaped transferred electron device;

FIG. 9 is a graph of the current waveform through the device of FIG. 8 after it has been triggered.

FIG. 10 is a schematic illustration of another embodiment of the present invention.

DETAILED DESCRIPTION OF THE DRAWINGS

Figure 1:
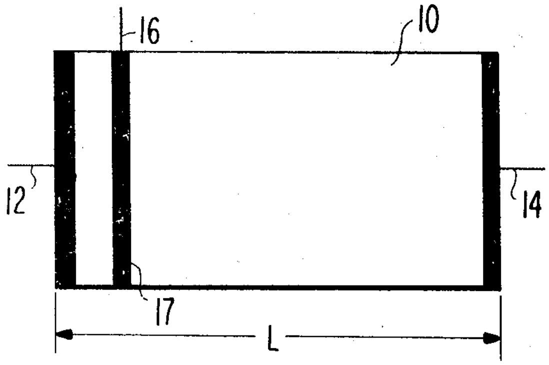
FIG. 1 is a schematic representation of a transferred electron device.

Referring generally to FIGS. 1, 2, 3, and 4, a three-terminal transferred electron device 10 having a Schottky gate is shown. A three-terminal transferred electron device (hereinafter referred to as a TED) 10 comprises a cathode terminal 12, an anode terminal 14, and a gate terminal 16. The cathode terminal 12 and the anode terminal 14 provide for contacts to the semiconductor device 10. The gate terminal 16 is connected to a metallic strip gate 17 which extends along the device 10 in close proximity to the cathode terminal 12 forming a Schottky barrier gate. Because the gate 17 is close to the cathode 12, if the gate 17 is made sufficiently negative with respect to the cathode 12 a depletion region is formed under the gate 17 thereby concentrating the existing field lines causing them to exceed the threshold field of the device 10 and thereby causing domain nucleation. Thus, the gate terminal 16 provides the dual function of being an input terminal to the device 10 and of allowing for a smaller input voltage to control the device. While a three-terminal transferred electron device can be made of any material which exhibits the transferred electron effect, the devices used in the preferred embodiment are comprised of gallium arsenide.

Figure 2:
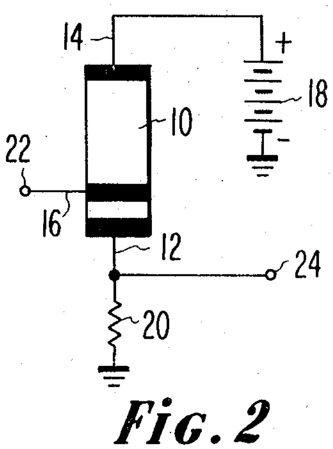
FIG. 2 is a schematic of a circuit employing a transferred electron device.
Figures 3A, 3B:
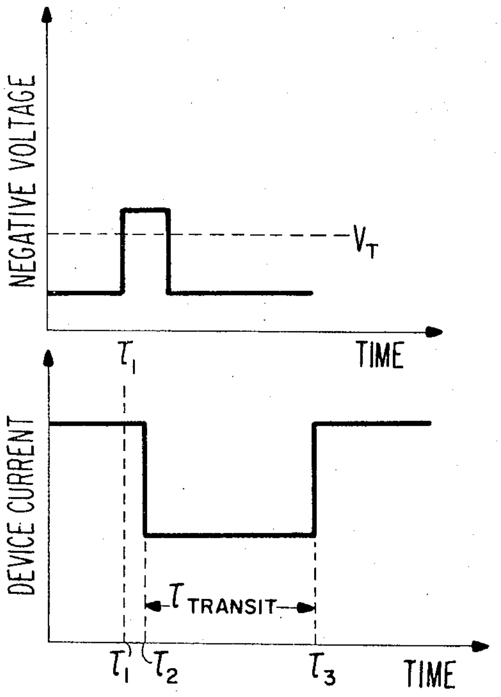
FIG. 3*a* is a graph of a voltage waveform used for triggering a transferred electron device.
FIG. 3*b* is a graph of the current waveform of the device of FIG. 1 after it has been triggered.

Referring in particular to FIG. 2, the TED 10 is shown in a circuit wherein the anode 14 of the device 10 is connected to the positive terminal of a DC biasing source 18. The cathode 12 of the device 10 is shown connected to one terminal of a resistor 20 whose other terminal is connected to ground. The input terminal 22 of the circuit is shown connected to the gate 16 of the device 10 and the output terminal 24 is connected to the cathode 12 of the device 10. The device 10 is biased below the threshold voltage required for oscillation. If a negative voltage pulse of greater magnitude than $v_T$, the minimum threshold voltage, as shown in FIG. 3*a*, is applied to the gate 16 at time $\tau_1$, a domain will be nucleated at the cathode 12, and this domain will travel from the cathode 12 to the anode 14 with a velocity of approximately $10^7$ cm/sec in a gallium arsenide TED 10. While the domain travels through the device 10, the device current will be uniformly reduced as shown in FIG. 3*b*. This will be called a "uniform device current." The time delay between the application of the gate pulse and the corresponding drop in device current, from $\tau_1$ to $\tau_2$, the inherent device delay, is quite small. Experimentally, this time delay has been shown to be on the order of 40 picoseconds.

As shown in FIG. 3*b*, the device current will remain at a low value until time $\tau_3$ when it will return to its normal quiescent value until such time as another pulse is presented to the gate 16 of the device 10. The time from $\tau_2$ to $\tau_3$ during which the device has a reduced current corresponds to the transit-time of the device 10. The transit-time of a transferred electron device can be found from the formula:

$$\tau_{Transit} = L/v,$$

wherein L corresponds to the length of the device and, $v$ refers to the domain velocity, which is approximately $10^7$ cm/sec in gallium arsenide. Thus, for example, if a particular device has a length, L, equal to $100\mu$, the transit-time for the device will be approximately 1 nonosecond. It should be noted, however, that other III–V compounds, such as indium-phosphide, which exhibit the transferred electron effect have electron velocities which differ from that of gallium arsenide.

Figure 4:
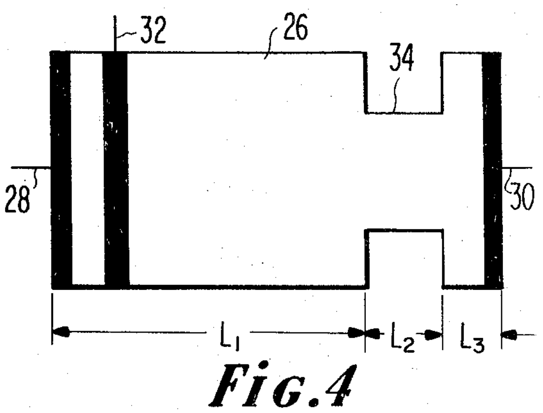
FIG. 4 is a schematic illustration of a shaped transferred electron device.

Referring now to FIG. 4, there is shown a shaped TED 26 which will constitute the basic building block for one embodiment 100 of the present invention shown in FIG. 6. The shaped TED 26 comprises a cathode terminal 28, an anode terminal 30, and a gate terminal 32 adjacent the cathode 28. In addition, the shaped TED 26 further comprises a notch 34 spaced closely to the anode 30 and which is cut to a uniform depth into the body of the shaped TED 26. The notch 34 is located at a distance $L_1$ from the cathode 28 end of the device 26, and at a distance $L_3$ from the anode 30 end of the device 26. The notch 34 has a length $L_2$.

Figure 5:
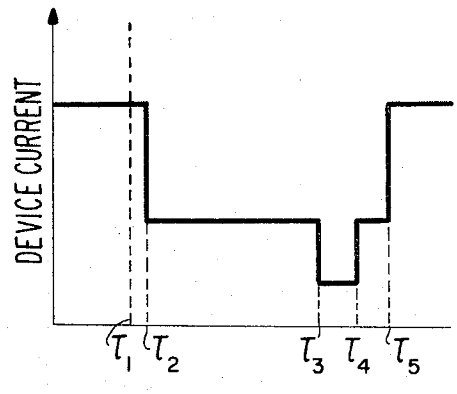
FIG. 5 is a graph of the current waveform through the device of FIG. 4 after it has been triggered.

When the shaped TED 26 is put into a circuit such as that shown in FIG. 2, and an input pulse is fed to the gate 32 of the device 26 of sufficient magnitude to nucleate a domain within the device 26, the current through the device will have non-uniform characteristics as shown in FIG. 5. To wit, if the input pulse occurs at time $\tau_1$, there will be an extremely short delay until time $\tau_2$ when a domain will nucleate within the device reducing the current through the device. This current will remain at a constant level until time $\tau_3$ which corresponds to the time that it takes for the domain to reach the notch 34 in the device 26. At time $\tau_3$, the current will again drop to a new level where it will remain until time $\tau_4$ which corresponds to the time that the domain will reach the anode side of the notch 34. The current will now rise to its previous level until time $\tau_5$ which corresponds to the time when the domain reaches the anode 30 of the device 26. At that time, the domain will be collected causing the current to return to the normal bias current through the device. This relationship between the waveform of the current through the device and the shape of the device has previously been recognized by Solomon et al in U.S. Pat. No. 3,601,713. This type of current waveform will be referred to as a "non-uniform current characteristic."

Referring now generally to FIG. 6, an embodiment 100 of the semiconductor delay circuit of the present invention is shown. The circuit 100 comprises a shaped TED 26 of the type shown in FIG. 4 and an active element such as the TED 10 of the type shown in FIG. 1. By the term "active element" is meant either a discrete element or a circuit having an input terminal and an output terminal and having the characteristic of providing an output signal which differs from its quiescent biasing point output signal when some threshold level of voltage or current has been presented to the input terminal in order to trigger the active element. The circuit 100 further comprises a DC biasing source 36 and two resistors 38, 40. The anode terminals 30, 14 of the shaped TED 26 and the conventional TED 10 respectively are connected to the positive side of the DC biasing source 36. The gate terminal 32 of the shaped TED 26 will constitute the input to the circuit 100. The gate terminal 16 of the conventional TED 10 constitutes the input terminal of the active element 10 and is connected both to the cathode terminal 28 of the shaped TED 26 and to the first resistor 38. The remaining terminal of the first resistor 38 is connected to ground as is the negative terminal of the DC biasing source 36 and one terminal of the second resistor 40. The other terminal of the second resistor 40 is connected to the cathode terminal 12 of the conventional TED 10 which constitutes the output terminal of the active element. The output of the delay circuit 100 is taken from the cathode terminal 12 of this TED 10.

The resistors 38, 40 are chosen so that the shaped TED 26 is biased at a point just below the threshold voltage required for domain nucleation, and the resistor 40 is chosen so that the TED 10 is biased just above the domain-sustaining voltage and well below the threshold voltage for this device 10.

When a negative pulse such as that shown in FIG. 3*a* is imposed upon the gate 32 of the TED 26, a domain will be formed within the device 26 causing the current through the device 26 to vary nonuniformly as shown in FIG. 5. The reduction in the current through the device 26 causes a concomitant reduction in the voltage across the resistor 38 connected to the cathode 28 of the device 26, thereby presenting a negative pulse to the gate 16 of the TED 10. This negative pulse will not be of sufficient magnitude to nucleate a domain in this TED 10 until such time as the domain in the shaped TED 26 reaches the notch 34 in the shaped TED 26. At that time, there will be a further reduction in the current through the shaped TED as shown in FIG. 5 with a corresponding reduction in the voltage across the resistor 38 and at the gate 16 of the TED 10. The time delay required for the domain in the shaped TED 26 to reach the notch 34 can be determined from the formula:

$$\tau_{Delay} = L_1/v$$

wherein $L_1$ corresponds to the length between the cathode 28 and the notch 34 as shown in FIG. 4, and $v$ corresponds to the domain velocity of $10^7$ cm/sec in gallium arsenide. $\tau_{Delay}$ corresponds to the time from $\tau_2$ to $\tau_3$ as shown in FIG. 5.

After time $\tau_{Delay}$, when the current through the shaped TED 26 drops, the voltage across resistor 38 and at the gate 16 of the TED 10 will be reduced below the point where the TED 10 will be triggered and a domain will be nucleated causing a reduction in the current through this TED 10 as shown in FIG. 3*b*. This reduced current through the TED 10 will cause a corresponding drop in the voltage across the resistor 40, thereby causing a drop in the output voltage measured across resistor 40. The output voltage will again rise to the normal bias voltage after time $\tau_{Transit}$ for the TED 10. Thus, if the original signal applied to the gate terminal 32 of the shaped TED 26 was a pulse of duration $\tau_{Transit}$ it will be reformed at the output of the delay circuit 100 after a time corresponding to $\tau_{Delay}$.

As will be obvious to one skilled in the art, if it is desired to have longer delay times they can be achieved either by increasing the length $L_1$ for the shaped TED 26, or by cascading shaped TED's in series. What is meant by cascading TED's in series is using the gate terminal of each TED as the input to a delay stage and the cathode terminal as the output of that stage. The input of the first stage, or delay unit, constitutes the delay line input and the output of the last stage, or delay unit, constitutes the delay line output as shown in FIG. 7 wherein a three-stage delay line circuit 110 is shown. The three-stage delay line 110 comprises three shaped TED's 26*a*, 26*b*, and 26*c* of the type shown in FIG. 4 and one conventional TED 10 of the type previously referred to in FIG. 1. The anode terminals 30*a*, 30*b*, 30*c*, and 14 of the devices 26*a*, 26*b*, 26*c*, and 10 are connected together and to the positive terminal of a DC biasing source 44. The gate terminal 32*a* of the first shaped TED 26*a* constitutes the input to the circuit 110. The cathode terminal 28*a* of the first shaped TED 26*a* is connected both to a resistor 38*a* and to the gate terminal 32*b* of the second shaped TED 26*b*. The cathode terminal 28*b* of the second shaped TED 26*b* is connected both to one terminal of a resistor 38*b* and to the gate terminal 32*c* of the third TED 26*c*. The cathode terminal 28*c* of the third shaped TED 26*c* is connected both to one side of a resistor 38*c* and to the gate terminal 16 of the TED 10. The cathode terminal 12 of the TED 10 is connected both to one side of a resistor 40 and to the output of the circuit 110. The remaining terminals of the resistors 38*a*, 38*b*, 38*c*, and 40 are all connected to each other and to ground as is the negative terminal of the DC biasing source 44. If it is assumed that the resistors 38*a*, 38*b*, 38*c*, and 40 are properly chosen to so bias their respective TED's 26*a*, 26*b*, 26*c*, and 10 so that they will not turn on until their threshold voltages have been applied to their respective gates, it can be seen from the previous discussion that when a negative pulse is presented to the gate 32*a* of the first shaped TED 26*a* of sufficient magnitude to nucleate a domain within this device 26*a*, that the current through this device will have the form of FIG. 5. After a time, $\tau_{Delay}$, a pulse of sufficient magnitude to nucleate a domain in the second device 26*b* will be presented at the gate 32*b* of this second device 26*b* and will nucleate a domain within this device 26*b*. The current through this device 26*b* will now have the waveform of FIG. 5. After an additional time, $\tau_{Delay}$, the current through this device 26*b* will drop as shown in FIG. 5 causing a negative voltage at the gate 32*c* of the third TED 26*c* of sufficient magnitude to nucleate a domain within this device 26*c*. The current through this device 26*c* will also have the waveform of FIG. 5. After an additional time, $\tau_{Delay}$, a negative pulse will be presented at the gate 16 of the TED 10 of sufficient magnitude to nucleate a domain in the TED 10. The current through the TED 10 will then have the waveform shown in FIG. 3. Thus, an output voltage will be presented at the cathode terminal 12 of the TED 10 after a delay of 3 $\tau_{Delay}$ from the time that the original input pulse was presented at the gate 32*a* of the first shaped TED 26*a*.

As will be obvious to one skilled in the art, by using one conventional TED of the type shown in FIG. 1 together with N shaped TED's of the type shown in FIG. 4, and circuits of the general type shown in FIG. 7, it is possible to build delays of N times $\tau_{Delay}$, where N is an integer. Furthermore, it should be recognized that in circuits where there is no requirement to reshape the input pulse after the delay, the conventional TED will not be necessary. In such circuits, it will merely be necessary to adjust the bias on the next stage so that there will not be any triggering of the next stage until such time as the domain through the shaped TED has reached the notch, thereby causing the current through the shaped TED and the voltage across its related biasing resistor to drop.

Referring generally to FIG. 8, a funnel-shaped TED 46 is shown. The funnel-shaped TED 46 comprises a substantially funnel-shaped body having a cathode terminal 48, a gate terminal 50 adjacent the cathode 48, and an anode terminal 52. The body of this TED 46 has three regions. The first and third regions, of lengths $L_4$ and $L_6$ respectively, have substantially parallel sides, while the second region, of length $L_5$, has sides which converge toward one another being widest apart where the second region meets the first region and having its narrowest point where the second region meets the third region close to the anode terminal 52. When the funnel-shaped TED 46 is connected in a circuit such as that shown in FIG. 2, and an input pulse such as that shown in FIG. 3*a*, of sufficient magnitude to nucleate a domain in the TED 46, is presented at the gate 50 of the device 46, the current through the device will be nonuniform in that it will have the waveform shown in FIG. 9. From time $\tau_2$ when a device current drops within this TED 46 to time $\tau_3$, the current through the device 46 will have a constant value lower than its initial quiescent value. From time $\tau_3$ to time $\tau_4$, the current will monotonically decrease so that at time $\tau_4$ the current will have its lowest value. After time $\tau_4$, the current will again rise and will have a constant value until time $\tau_5$ when it will return to the quiescent value due to the capture of the domain at the anode 52 of the device 46.

Referring generally to FIG. 10, a variable delay circuit 120 is shown. The variable delay circuit comprises a funnel-shaped TED 46 having an anode terminal 52 connected to the anode terminal 14 of a conventional TED 10 as well as to the positive terminal of a DC biasing source 54. The gate terminal 50 of the funnel-shaped TED 46 will constitute the input to the variable delay circuit 120. The cathode terminal 48 of the funnel-shaped TED 46 is connected to one terminal of a resistor 56 and to one terminal of a coupling capacitor 58. The other terminal of the coupling capacitor 58 is connected to the gate terminal 16 of the conventional TED 10 and to a variable voltage supply 60. The variable voltage supply 60 may comprise either a conventional resistor voltage-divider network connected to the DC bias supply 54 or a separate variable DC bias supply 62 as shown in FIG. 10. The variable voltage supply 60 further includes a low pass filter such as an inductive element 61. The cathode terminal 12 of the conventional TED is connected to one side of the resistor 66 and to the output of the variable delay circuit 120. The other terminal of the resistor 66 is connected to ground as are the remaining terminals of the first resistor 56, the variable DC bias supply 62, and the DC biasing supply 54.

In operation of the variable delay circuit 120, a voltage level less than the required threshold of the TED 10 is set on the variable DC bias supply 62. An input signal imposed upon the gate 50 of the funnel-shaped TED 46 will cause a voltage waveform such as that shown in FIG. 9 to be presented across the resistor 56. Because this will be an AC signal, it will be coupled through the capacitor 58 to the gate terminal 16 of the TED 10 where it will be added to the DC bias voltage at the gate 16 of the TED 10. The time following the initial imposition of the input pulse upon the gate 50 of the funnel-shaped TED 46 to the time when the required threshold voltage of the TED 10 will be presented at the gate 16 will depend upon the voltage level set by the variable voltage supply 60 as well as upon the slope of the voltage waveform across resistor 56 determined by the geometry of the funnel-shaped TED 46. By suitably adjusting the variable voltage supply 60, the TED 10 can be made to trigger a domain at either $\tau_2$ or at any time between $\tau_3$ and $\tau_4$. Thus, a variable delay can be achieved by this circuit 120. As will be obvious to one skilled in the art, these delay circuits 100, 120 can be combined with one another to achieve different forms of delays. Also, by automatically modulating the variable voltage supply 60, forms of frequency modulation and pulse code modulation can be achieved. Furthermore, as with the delay circuit 110 of FIG. 7, if there is no necessity to reshape the input pulse at the output of the variable delay 120, the conventional TED 10 will not be required. In such cases, the bias on the next stage should be adjusted for triggering when the sum of the voltage across the biasing resistor associated with the funnel-shaped TED 46 and the voltage of the variable voltage supply are such that the triggering level of the next stage will be surpassed.

I claim:

1. A semiconductor delay line comprising:

a. a first transferred electron device having input, output and third terminals, said device generating an output signal in response to a predetermined D.C. bias voltage coupled to said first device third terminal and an input signal having a predetermined waveform coupled to said first device input terminal, said first device output signal having a nonuniform current characteristic;

b. an active element having input and output terminals;

c. means for biasing said transferred electron device at a voltage above its domain sustaining voltage and below its threshold voltage;

d. means for biasing said active element below its triggering threshold; and e. means for coupling said first device output signal from said first device output terminal to said input terminal of said active element whereby said active element will be triggered by said transferred electron device into generating an active element output electrical signal having said input signal waveform following a delay determined by said nonuniform current characteristic of said transferred electron device output signal, said biasing means for said transferred electron device and said threshold level of said active element.

2. The semiconductor delay line of claim 1 wherein said active element comprises a second transferred electron device having input, output and third terminals, said second device input terminal being coupled to said first device output terminal and means for biasing said second device above its domain sustaining voltage and below its threshold voltage.

3. The semiconductor delay line of claim 1 wherein said means for biasing said first transferred electron device comprises a DC biasing source having a positive terminal connected to said third terminal of said first device and a resistor serially connected between said first device output terminal and reference potential.

4. The semiconductor delay line of claim 2 wherein said means for biasing said second transferred electron device comprises a DC biasing source having a positive terminal connected to said third terminal of said second device and a resistor serially connected between said second device output terminal and reference potential.

5. The semiconductor delay line of claim 2 wherein said means for coupling said first device output signal to said input terminal of said second transferred electron device comprises an electrical connection between said output terminal of said first transferred electron device and said input terminal of said second transferred electron device.

6. The semiconductor delay line of claim 2 wherein said second transferred electron device output signal has a uniform current characteristic.

7. The semiconductor delay line of claim 2 wherein said second transferred electron device output signal has a nonuniform current characteristic.

8. The semiconductor delay line of claim 7 further comprising at least one additional transferred electron device having input, output and third terminals, said device generating an output signal having a nonuniform current characteristic, in response to a predetermined DC bias voltage coupled to said third terminal and said output signal from said second transferred electron device coupled to said additional transferred electron device input terminal, and said additional device having a resistor serially connected between said additional device output terminal and reference potential for biasing said additional transferred electron device at a point above its domain sustaining voltage and below its threshold voltage.

9. The semiconductor delay line of claim 8 further comprising a terminating transferred electron device having input, output and third terminals, said terminating device generating an output signal having a uniform current characteristic in response to a predetermined DC bias voltage coupled to said third terminal and said output signal from said additional transferred electron device coupled to said terminating transferred electron device input terminal, said terminating transferred electron device having a resistor serially connected between said terminating device output terminal and said reference potential for biasing said terminating transferred electron device at a point above its domain sustaining voltage and below its threshold voltage.

10. The semiconductor delay line of claim 1 further comprising means for adjusting said threshold level of said active element.

11. The semiconductor delay line of claim 10 wherein said nonuniform current characteristic of said first transferred electron device monotonically decreases after a domain has been nucleated within said first transferred electron device.

12. The semiconductor delay line of claim 10 wherein said coupling means comprises a circuit of the type which will segregate direct current while passing alternating current signals.

13. The semiconductor delay line of claim 11 wherein said means for adjusting said threshold level comprises an adjustable DC biasing source, said DC biasing source being AC isolated from said output terminal of said first transferred electron device and from said input terminal of said second transferred electron device.

14. The semiconductor delay line of claim 11 wherein said coupling means comprises a capacitor having one terminal connected to said output terminal of said first transferred electron device and having the other terminal connected to said input terminal of said active element.

15. A semiconductor delay line comprising a plurality of delay units cascaded in series, each delay unit comprising:

a. a transferred electron device having anode, cathode and gate terminals, said device generating an output signal in response to a predetermined DC bias voltage coupled to said anode terminal and an input signal coupled to said gate terminal, said output signal having a nonuniform current characteristic;

b. a biasing resistor connected between said cathode of said transferred electron device and a ground terminal;

c. an input terminal connected to said gate terminal of said transferred electron device;

d. an output terminal connected to said cathode terminal of said transferred electron device; and e. a bias supply connected between said anode terminal of said transferred electron device and said ground terminal.

* * * * *